(12) United States Patent
Dunn et al.

(10) Patent No.: US 6,239,579 B1
(45) Date of Patent: May 29, 2001

(54) DEVICE FOR MANAGING BATTERY PACKS BY SELECTIVELY MONITORING AND ASSESSING THE OPERATIVE CAPACITY OF THE BATTERY MODULES IN THE PACK

(75) Inventors: James H. Dunn, Limoges; Julio C. de Oliveira, Gloucester; David H. Gerwing, Greely, all of (CA)

(73) Assignee: Estco Battery Management Inc., Nepean (CA)

( * ) Notice: Subject to any disclaimer, the term of this patent is extended or adjusted under 35 U.S.C. 154(b) by 0 days.

(21) Appl. No.: 08/887,844

(22) Filed: Jul. 3, 1997

Related U.S. Application Data

(60) Provisional application No. 60/021,185, filed on Jul. 5, 1996.

(51) Int. Cl.[7] .......................... H02J 7/00; G01N 27/416
(52) U.S. Cl. ........................... 320/121; 320/119; 324/426
(58) Field of Search .................................. 320/121, 119, 320/126, 128; 324/426

(56) References Cited

U.S. PATENT DOCUMENTS

| | | | | |
|---|---|---|---|---|
| 3,102,222 | * | 8/1963 | Harmer ................................ | 320/119 |
| 3,930,192 | * | 12/1975 | Dinkler ................................ | 320/119 |
| 4,484,140 | | 11/1984 | Dieu . | |
| 4,616,170 | * | 10/1986 | Urstoger ............................... | 320/119 |
| 4,707,795 | | 11/1987 | Alber et al. . | |
| 4,709,202 | * | 11/1987 | Koenck et al. ....................... | 320/112 |
| 5,153,496 | * | 10/1992 | LaForge ............................... | 320/119 |
| 5,498,950 | * | 3/1996 | Ouwerkerk ........................... | 320/119 |
| 5,543,245 | | 8/1996 | Andrieu et al. . | |
| 5,557,189 | * | 9/1996 | Suzuki et al. ........................ | 320/119 |
| 5,583,440 | * | 12/1996 | Bisher ................................. | 324/427 |
| 5,644,208 | * | 7/1997 | Abiven ................................ | 320/118 |
| 5,661,463 | * | 8/1997 | Letchak et al. ...................... | 340/636 |
| 5,703,404 | * | 12/1997 | Karunasiri et al. .................. | 320/125 |
| 5,710,503 | * | 1/1998 | Sideris et al. ........................ | 320/431 |
| 5,811,959 | * | 9/1998 | Kejha .................................. | 320/126 |

FOREIGN PATENT DOCUMENTS 0 348 839  of 1990  (EP) .
97 28574  of 1997  (WO) .

* cited by examiner

Primary Examiner—Peter S. Wong
Assistant Examiner—Gregory J. Toatley
(74) Attorney, Agent, or Firm—Robert A. Wilkes

(57) ABSTRACT

The invention relates to a device for managing battery packs by measuring and monitoring the operating capacity of individual battery modules in a battery pack. A programmable logic controller directs the selective closing of relays to allow individual battery modules to be load-tested using a variable discharge load unit, without compromising useful battery pack capacity. A battery module whose useful capacity falls below a predefined threshold may be connected to a battery charger for replenishment and then electrically realigned with the remaining modules in the pack for continued operation. Alternatively, an alarm may be triggered which alerts the user that the module is due for replacement. This sequence of events is performed on all cells in the pack at a predetermined interval.

11 Claims, 4 Drawing Sheets

INSERTED CONNECTION CIRCUIT

BRIDGED CONNECTION FLOWCHART

DEVICE FOR MANAGING BATTERY PACKS BY SELECTIVELY MONITORING AND ASSESSING THE OPERATIVE CAPACITY OF THE BATTERY MODULES IN THE PACK

This application claims priority from Provisional application 60/021,185 filed Jul. 5, 1996.

BACKGROUND TO THE INVENTION

The present invention relates to a device for directly monitoring, assessing and managing the useful capacity and health of batteries.

The invention may be used in conjunction with any device or system which is battery-powered, or which uses a battery pack as an alternative or back-up power source, such as railway level crossing and switch systems; mobile electronic equipment battery packs used in cellular telephones, computers, camcorders; electric vehicles; computers; telecommunication or station batteries; telephone switching facilities and portable test equipment.

Battery users currently have no accurate means for determining the useful capacity of batteries, e.g. those used as a back up for a primary AC power source. Conventional devices measure voltage, impedance, electrolyte specific gravity or other battery characteristics, but do not provide the user with direct information concerning the length of time the battery will operate under load.

In a preferred embodiment, the invention enables the capacity and health of a battery to be assessed, monitored and managed from a remote site.

By way of example, the present invention has utility as a safety device for integration with systems which operate railroad crossings. Safety at railroad crossings has become a major source of railway liability over the last ten years. In accordance with established safety guidelines, some jurisdictions require railroad companies to guarantee a minimum number of hours of direct current (DC) backup power to the power gate arms and flashing warning lights located at these level crossings. Such regulations have heightened the need for enhanced battery management systems.

As a preventive measure, many level crossings in North America have been equipped with a device known as a Crossing Analyzer ("CA"). A Crossing Analyzer is a computer controlled data application system which records the amperage draw of each light and the position and amperage draw of each gate at the level crossing. The CA is also fitted with a modem to forward alarms to a central monitoring station should there be a problem. In fact, one railroad company is so concerned about the safety of their level crossings that they have programmed their CA's to dial in every twenty-four hours, to provide a constant monitoring of the system. If a call is not received for a particular level crossing, a railway maintainer is dispatched to diagnose the problem immediately.

In the event of an AC power failure, it is essential that the DC battery back-up power operate efficiently and at the required capacity. To date, there has been no practical method to load test a back-up battery at a remote site.

SUMMARY OF THE INVENTION

The present invention addresses the disadvantage inherent in the prior art by providing a device for directly assessing the useful capacity of a back-up battery, even where the battery is located at a remote site and without compromising the ability of the back-up battery to operate should there be an AC power failure during the battery testing.

This objective is achieved by performing a sequential, individual assessment of each module which comprises a battery pack. Where used in this specification, the term "module" means one or more electrochemical cells.

A further advantage of the present invention arises from its capability to rejuvenate or boost the health of the battery module of certain chemistries, e.g. nickel/cadmium. The discharge/charge sequence which is carried out in order to assess and monitor the useful capacity of the module, also serves to better cycle the module.

In one aspect, the invention provides a system for directly assessing the useful capacity of an online battery pack, comprising: a programmable logic controller operatively connected to a monitor circuit and to one or more battery modules comprising said battery pack, said monitor circuit comprising battery module charging means, and discharge load means; wherein said programmable logic controller selectively and sequentially opens and closes a plurality of relays which connect with said charging means and said discharge load means to alternatively define a discharge circuit which enables one of said modules to be discharged by said discharge load means under a predefined load, the useful capacity of said module being calculated by said programmable logic controller.

In a second aspect, the invention provides a device for directly assessing the useful capacity of at least one battery module within a battery pack, comprising: a programmable logic controller operatively connected to a plurality of battery modules comprising a battery pack, battery module charging means, and discharge load means; wherein each of said modules may be selectively isolated from the other said cells defining said battery pack, by the opening and closing of relays which connect said modules with said discharge load means and said battery module charging means, enabling said module to be selectively and sequentially discharged by said discharge load means and then recharged by said battery module charging means.

Preferably, the programmable logic controller comprises, or is operatively connected to at least one module voltage reader; battery pack current reader and module current reader; a switch controller to control said isolation relays; a controller for said variable discharge load means and said single module battery charger (charger/discharger controller).

In an additional aspect, the invention provides a method of sequentially assessing the operating capacity of a plurality of battery modules which define a battery pack, which comprises the steps of:

selecting one of said modules for assessment;

connecting said selected module to a variable discharge load means by closing relays which connect said module to said variable discharge load means;

measuring parameters which define the useful capacity of said module, while said module is under load;

disconnecting said selected module from said variable discharge load means by opening said relays and either; (a) connecting said selected module to a battery charger for recharging; and (b) reconnecting said selected module to said plurality of modules by the selective opening and closing of relays which connect said modules with said battery charger, and said variable discharge load;

wherein the coordination of all of the above steps is accomplished by the use of a programmable logic controller operatively comprising, in combination, at least one voltage reader; at least one battery pack current reader; at least one module current reader; and a switch controller to control the opening and closing of said relays.

In a further aspect, the invention provides a method of sequentially assessing the useful capacity of a plurality of battery modules which define a battery pack, which comprises the steps of:

selecting one of said modules for assessment;

connecting said selected module to a variable discharge load means by closing relays which connect said module to said variable discharge load means;

measuring parameters which define the useful capacity of said module, while said module is under load;

determining whether said useful capacity meets a predefined threshold for useful capacity;

disconnecting said selected module from said variable discharge load means by opening said relays and either;

recharging said selected module by connecting said selected module to a battery charger where said useful capacity meets said predefined threshold; or generating a signal where said useful capacity does not meet said predefined threshold;

wherein the above steps are coordinated by a programmable logic controller operatively comprising, in combination, at least one voltage reader; at least one battery current reader; at least one module current reader; and a switch controller to control the opening and closing of said relays.

Where the useful capacity of the selected module satisfies the threshold, the selected module is reinserted into the circuit which defines the battery pack by reconnection of the selected module to the other modules which define the battery pack by the selective opening and closing of relays which connect the modules with the batter charger, and the variable discharge load. If the useful capacity of the selected module as measured does not meet the predefined threshold, another module is substituted for the selected module within the circuit which defines said battery pack. The substitution module may be inserted into the circuit by the selective opening and closing of relays which connect the modules with the battery charger, and the variable discharge load.

A still further aspect of the invention provides a device for cycling batteries, comprising: a programmable logic controller operatively connected to a monitor circuit and to one or more battery modules comprising said battery pack, said monitor circuit comprising battery module charging means, and discharge load means; wherein said programmable logic controller selectively and sequentially opens and closes a plurality of relays which connect with said charging means and said discharge load means to alternatively define a discharge circuit which enables one of said modules to be discharged by said discharge load means under a predefined load.

An additional aspect of the invention provides a device for enhancing the useful capacity and/or reducing the rate of capacity loss of battery packs during service by using an optimal recharge method on battery modules which comprise said battery pack while said battery pack remains in service.

DESCRIPTION OF THE PREFERRED EMBODIMENT

The invention comprises a programmable logic controller (PLC) or computer, coupled to a plurality of multi-pole contactors, relays or solid state switching devices. The invention isolates one of the multiple modules in the battery pack (typically nine or eleven modules) by taking the cell out of the trickle/float charge circuit and then performing a discharge of the battery module which drains the energy of the module into variable discharge means such as a fixed resistance heater or similar device at the normal rated load capacity for that module. The PLC then records which module is being discharged, and how long it takes to discharge to a pre-programmed cut-off voltage. This information is then used to calculate how much energy the module was able to deliver under actual loaded conditions, thereby providing a real measure of its useful capacity. The information on module capacity is provided by way of a liquid crystal display, or similar means, and is given in watt-hours, ampere-hours; % of "as new" or the time to failure under load in minutes, whichever is required by the end user. When the measured capacity falls below a predefined threshold an alarm will be triggered, signalling the need for battery or module replacement. The battery module charger will be engaged to recharge the discharged module.

The invention may be used in conjunction with rechargeable batteries of various chemical composition(s). Some are sealed, others are flooded while others are valve-regulated/batteries. The typical chemistry of the batteries is nickel/cadmium or lead-acid. The threshold voltage is established having regard to the chemistry of the module.

In a first embodiment (inserted connection), the module to be measured is isolated from the other modules comprising the battery pack by the selective engagement of isolation relays. The module is then discharged, its capacity is measured by the PLC as a function of the discharge load, and it is then recharged. In this embodiment, the isolated module is temporarily unable to contribute to the output of the battery. The procedure is sequentially repeated, at selectable times, for the remaining modules which comprise the battery pack.

Only one battery module at a time is discharged so that the system is never more than ⅑ or 11% short of its maximum ampere-hour or watt-hour energy capacity (in the case of a nine cell battery pack). In the event of an AC power outage (i.e. a situation where the DC battery pack is engaged), when one of the modules is not fully charged, this module is kept out of the circuit by the use of isolation relays.

Figure 1:
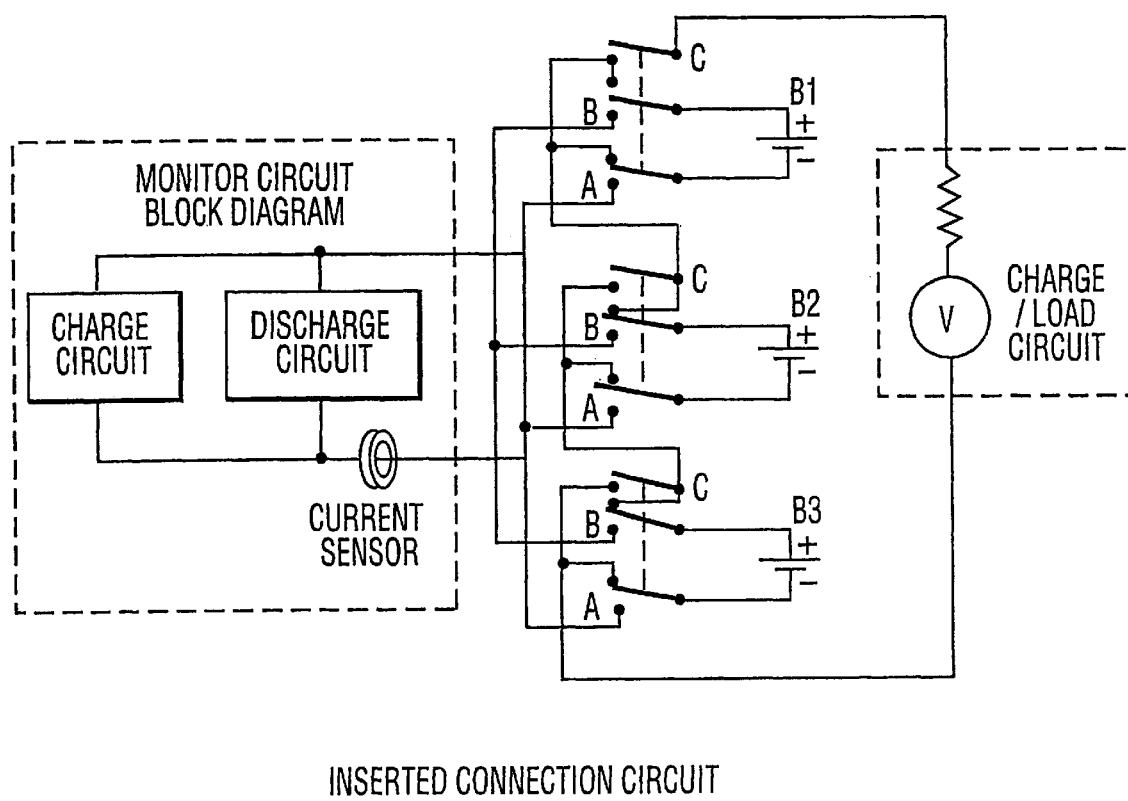
FIG. 1 is a schematic drawing of one embodiment of the invention, depicting an inserted connection circuit.

FIG. 1 depicts an inserted connection circuit. Batteries B1, B2 and B3 operate a charge/load circuit V. Isolation relays or contacts A and B connect an individual module to a monitor circuit, while contact C closes the gap in the battery created by the removal of the module, when relay contact C is closed, the open circuit formed by the removal of the battery module, is closed, thereby allowing current to flow through the charge/load circuit. When isolation relays A, B are closed, an individual battery module can be isolated and connected to the monitor circuit. The monitor circuit discharges the isolated battery module and charges it as required using feedback provided by the current sensor and the preset voltage limits.

In the event of an AC mains failure, the relays must continue to operate, otherwise a discharged module would be re-introduced into the battery pack, reducing the useful capacity of the battery pack.

The battery voltage would normally be (Vc*N−1) where Vc is the nominal module voltage and N is the number of modules in the battery. As the monitor circuit moves from one module to the next, it causes a disruption in the battery pack voltage. The battery pack momentarily goes open-circuit, then the voltage jumps to Vc* N, then the battery pack goes open-circuit again, then finally the voltage returns to (Vc*N−1).

Figure 2:
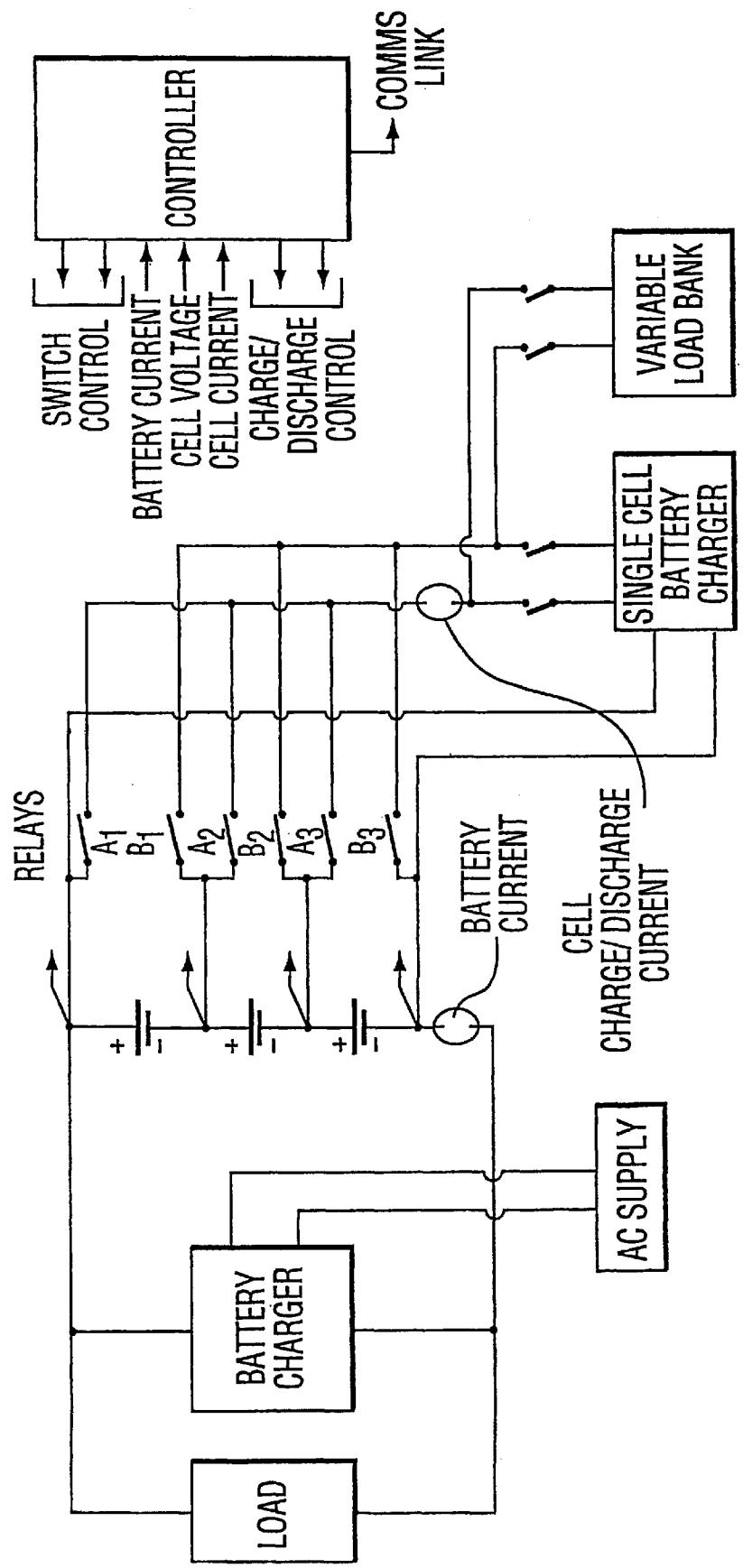
FIG. 2 is a schematic drawing of a further embodiment of the invention, depicting a bridged connection circuit with three modules.
Figure 3:
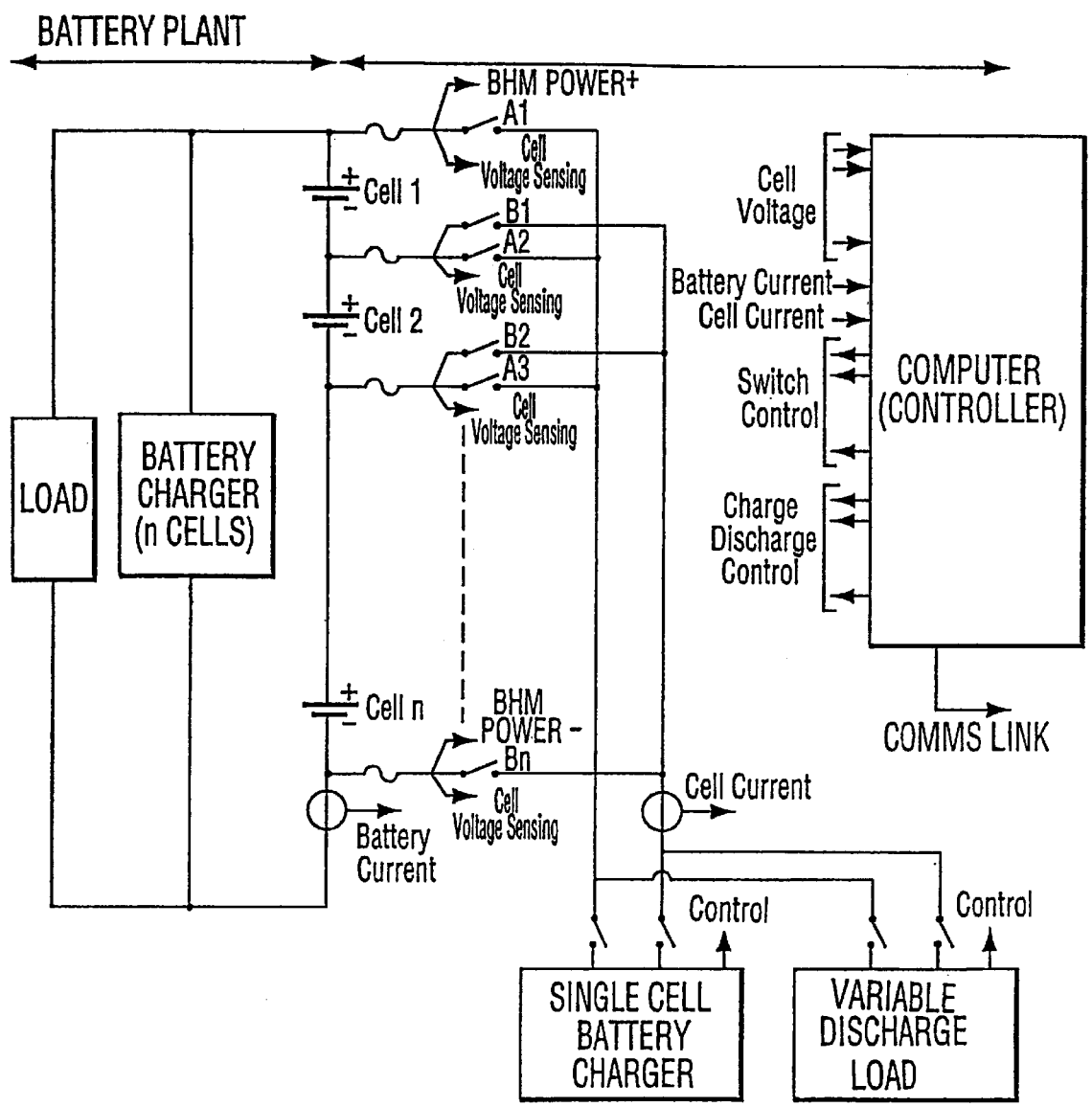
FIG. 3 is a schematic drawing of a further embodiment of the invention, depicting a bridged connection circuit with "n" modules.
Figure 4:
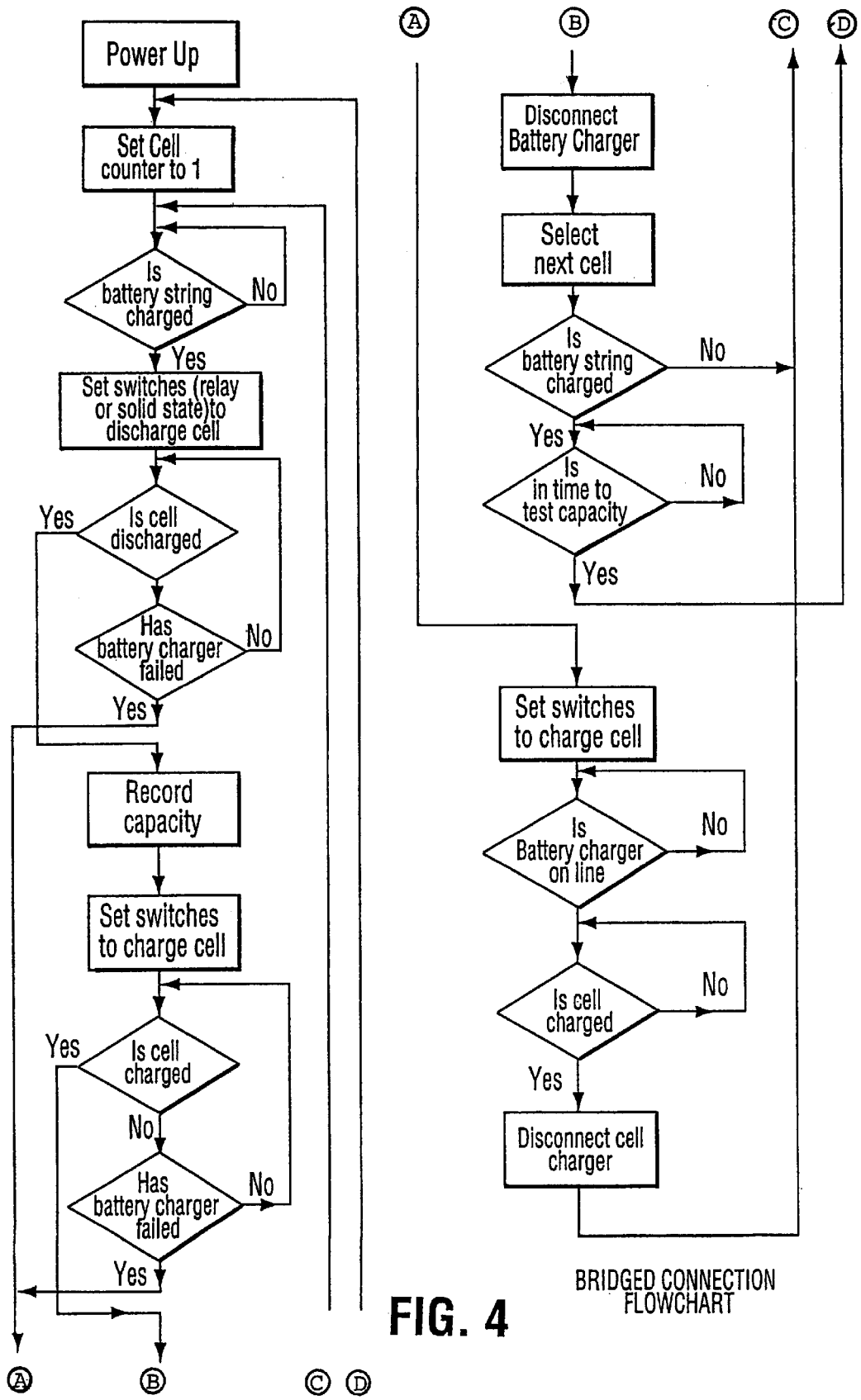
FIG. 4 is a flowchart, schematically depicting operation of the present invention.

In a second embodiment (bridged connection), the module which is being assessed need not be isolated from the other modules comprising the battery pack. FIGS. 2 and 3 schematically represent a bridged connection. A bridged circuit ensures that the electrical integrity of the battery pack does not have to be broken in order to assess a single module. Using the algorithm outlined in FIG. 4, the capacity of each module is sequentially calculated. The computer controls the opening and closing of isolation relays, the variable discharge load, as well as the module battery charger. Further the computer senses the following: battery pack string current and voltage, selected module charge/discharge current, selected module voltage, ambient temperature, and battery pack and/or module temperatures.

In FIG. 3, the battery pack is shown as operatively connected to a circuit comprising a load and a battery charger which represents the primary power source and load for which the battery pack is intended to provide back up, in order for the operative capacity of the back-up battery pack to be accurately measured, an allowance must be made for the current which flows from the primary power source into the battery pack. Use of Kirchoff's law, where +/−ic=+/−ip++/− im where +/− is positive for charge and negative for discharge, ic is module current, ip is current of the primary power circuit, and im is the current of the monitor device, enables the PLC to accurately and selectively measure the operative capacity of a given module within the battery pack without isolating or disengaging the module from the other modules which comprise the battery pack.

In operation, the controller selectively controls and co-ordinates the opening and closing of the switches which connect the battery charger and the variable discharge load. Where it is desired to measure the capacity of module or cell 1, isolation relays A1 and B1 are closed by command of the PLC, which then closes the relays which connect the variable discharge load with the battery. The discharge circuit which is thus created enables module or cell 1 to be discharged across the variable discharge load. Module current is measured by a reader within the circuit and fed back to the PLC. The PLC then causes the relays connecting the variable discharge load to the battery to open, and then closes the relays which connect the battery charger with the battery, thereby defining a charging circuit which recharges module 1 up to a threshold level which is consistent with the useful capacity of the other modules within the string. The procedure is then sequentially repeated for the remaining modules 2, 3, . . . n within the string.

Both the variable discharge load and a battery charger output are adjusted according to the ambient battery and module temperature present to prevent battery damage. As well, the computer calculates the a-h (ampere-hour) capacity of each battery cell by integrating the discharge current over the time taken to reach the cut-off voltage threshold, or the energy capacity by the above integration of current times voltage over discharge time in hours. An alternative to using computer control of the variable discharge load and battery charger is direct control using linear circuits.

The means used to discharge the module may be a use specific variable discharge profile, constant current, constant resistance, or constant power. The method chosen will depend on the battery technology and the normal usage. To implement these methods, a variable resistor or the like is typically used.

The battery charger used to recharge the module under scrutiny may operate with a variety of algorithms including constant voltage/current, constant power and fast charge methods, including pulse charging.

In another preferred embodiment, relays A, B and C shown in FIGS. 1, 2 and 3 may be replaced with solid state switches. However, solid state devices have the following characteristics which affect their suitability as replacements for relays:

1) They tend to have a voltage drop when conducting current. In the inserted connection embodiment, the battery voltage under load would be reduced somewhat (a fraction of a volt). In the case of the bridged connection, this problem could be reduced by sensing battery voltages at the connection to the invention;

2) Usually, two such solid state devices are needed for conducting in two directions. This increases the cost and complexity of the design;

3) Inputs are not isolated from outputs. This is somewhat problematic, since the monitor circuit needs to connect to points up and down the chain of modules making up the battery. If the battery voltage exceeds 30 volts, optical isolation is needed which further complicates the design.

Because of the problems outlined above, the use of solid state switches as replacements for relays A, B and C would be determined on a case by case basis. The most likely applications would be for batteries having voltages below 30 volts or with currents below a few amperes, or where the battery power levels are not much larger than the relay drive requirements or where the use of electromechanical relays is undesirable for other reasons.

The invention works as an integral part of the battery and is designed to continue to operate in the event of an AC power failure, and is able to provide a full load current to substitute for a partially discharged module. This ensures that the useful capacity of the battery pack is available and that the module is protected from reverse-voltage damage.

So that no capacity is lost in the unlikely event of the module battery charger failing when the isolated battery is discharged, extra capacity is provided in the form of an external module. This module will normally be float charged by the invention. When the battery charger fails during a discharge cycle, the external module or battery will be used to power the battery charger.

As an alternative to this method, an identical module to the battery modules in the battery pack can be added to the battery pack; for example, making a 9 module battery pack into a 10 module battery pack. In this case, the module battery charger will be powered from the battery pack.

In the event that there is a battery module with less useful capacity than the other modules in the pack, the invention can assess the state of health of the reduced capacity module and electrically isolate it from the rest of the battery pack, until such time as the rest of the pack has a poorer performing module than the isolated, reduced capacity module. In a further embodiment, the invention further comprises an alarm circuit which conveys an audible or visible warning signal that the capacity of the battery pack has fallen below useful level, which is particularly important where the battery pack is being used as a back-up power source. This provides the option of replacing individual batteries from the battery instead of the whole pack, thereby providing a substantial increase in battery pack life and a resulting decrease in battery cost to the user.

EXAMPLE 1

For application in a specific context, namely as a monitoring and management system to assess the operative capacity of railroad crossing back-up power systems, the invention may be housed in the same enclosure as the battery pack and the Crossing Analyzer (CA). As well, in a preferred embodiment, the present invention may be set up to access a spare input on the CA to notify the railroad dispatch centre of battery problems.

Alternately, where the railroad crossing is not equipped with CA, the railway maintainers could use an annunciator module to inquire about the health or operative capacity of each module in the battery pack during routine maintenance checks.

The embodiments of the invention in which an exclusive property or privilege is claimed are defined as follows:

1. A system for directly assessing and controlling the useful capacity of an online battery pack, comprising:
   a programmable logic controller operatively connected to a monitor circuit and to one or more battery modules comprising said battery pack, said monitor circuit comprising battery module variable charging means, and variable discharge load means; wherein said programmable logic controller selectively and sequentially opens and closes a plurality of relays which connect with said variable charging means and said variable discharge load means to alternatively define a discharge circuit which enables one of said modules to be variably discharged by said variable discharge load means under a predefined variable load wherein the useful capacity is calculated from a time and current required to discharge said module under said predefined variable load by said programmable logic controller.

2. A system as claimed in claim 1, further comprising means for recording of said data calculated by said programmable logic controller.

3. The system as claimed in claim 1 or 2 wherein said relays are selected from the group consisting of multi-pole relays, contactors or solid state switching devices.

4. A device for directly assessing the useful capacity of at least one battery module within a battery pack, comprising:
   a programmable logic controller operatively connected to a plurality of battery modules comprising a battery pack, variable battery module charging means, and variable battery load means; wherein each of said modules may be selectively isolated from the other said modules defining said battery pack, by the opening and closing of relays which connect said modules with said variable discharge load means and said battery module variable charging means, enabling a sequential and selective discharging of said modules to a selectable cut-off voltage level by said variable discharge load means along with a measurement of a time required to discharge said modules to a selectable cut-off voltage level and further enabling a subsequent recharging of said modules to a selectable recharge voltage level by said variable battery module charging means.

5. The device of claim 3 wherein said relays are selected from the group consisting of multi-pole relays, contactors or solid state switching devices.

6. The device as claimed in claim 4 wherein said device is integral with said battery pack.

7. A method of sequentially assessing the useful capacity of a plurality of battery modules which define a battery pack, which comprises the steps of:
   selecting one of said modules for assessment;
   connecting said selected module to a variable discharge load means by closing relays which connect said module to said variable discharge load means;
   measuring a time to discharge said module to a predetermined cut-off voltage level under the specific load which defines the useful capacity of said module, while said module is under the specific load;
   determining whether said useful capacity meets a predefined threshold for useful capacity;
   disconnecting said selecting module from said variable discharge load by means of opening said relays and either;
   recharging said selected module by connecting said selected module to a variable battery charger where said useful capacity meets said predefined threshold; or generating a signal where said useful capacity does not meet said predefined threshold;
   wherein the above steps are coordinated by a programmable logic controller operatively comprising: in combination,
   at least one voltage reader;
   at least one battery current reader;
   at least one module current reader; and
   a switch controller to control the opening and closing of said relays.

8. A method as claimed in claim 7 wherein said selected module is reinserted into the circuit which defines said battery pack by reconnecting said selected module to said plurality of modules by the selective opening and closing of relays which connect said modules with said battery charger, and said variable discharge load, following said recharging.

9. A method as claimed in claim 7 wherein an extra module is added to said battery pack to power said battery pack charger when said battery pack charger fails while selected module is discharged.

10. A method as claimed in claim 7 further including the step of using an optimal recharge method on said selected module, said optimal recharge method being determined by a state of charge of other modules.

11. A device for cycling batteries while the battery remains in service, comprising:
   a programmable logic controller operatively connected to a management and control circuit and to a battery module within a battery pack, said monitor circuit comprising variable battery module charging means, and variable discharge load means; wherein said programmable logic controller selectively and sequentially opens and closes a plurality of relays which connect with said variable charging means and said variable discharge load means to alternately define a discharge circuit enabling said module to be discharged by said discharge load means under a predefined load and enabling a measurement and calculation by the controller of discharge time and current required to discharge said module.

* * * * *